United States Patent [19]
Wada et al.

[11] 4,044,344
[45] Aug. 23, 1977

[54] METHOD OF AND APPARATUS FOR MEASURING INFORMATION HOLD TIME OF MEMORY CELL IN DYNAMIC MIS MEMORY

[75] Inventors: Hidetsugu Wada, Kokubunji; Yoichi Asano, Tokyo; Yoshikazu Suzumura, Fuchu, all of Japan

[73] Assignee: Hitachi, Ltd., Japan

[21] Appl. No.: 685,808

[22] Filed: May 12, 1976

[30] Foreign Application Priority Data

May 28, 1975 Japan .................................. 50-62901

[51] Int. Cl.² ........................ G11C 11/40; G11C 7/06
[52] U.S. Cl. ........................ 340/173 DR; 340/173 CA
[58] Field of Search ................... 340/173 R, 173 DR; 307/238, 279

[56] References Cited

U.S. PATENT DOCUMENTS

| 3,851,316 | 11/1974 | Kodama | 340/173 DR |
|---|---|---|---|
| 4,004,284 | 1/1977 | Heeren | 340/173 DR |

*Primary Examiner*—Terrell W. Fears
*Attorney, Agent, or Firm*—Craig & Antonelli

[57] ABSTRACT

In a MIS dynamic memory, information is written in the memory cell at a predetermined address, the access to other plural addresses is made for a fixed time period under such a condition that the memory cell of the predetermined address is not refreshed, and the stored information is thereafter read out of the memory cell of the predetermined address. The level of the read information is compared with a predetermined threshold value, thereby determining the information hold time of the memory cell.

2 Claims, 2 Drawing Figures

METHOD OF AND APPARATUS FOR MEASURING INFORMATION HOLD TIME OF MEMORY CELL IN DYNAMIC MIS MEMORY

BACKGROUND OF THE INVENTION

1. Field of the Invention

The present invention relates to a method of and an apparatus for measuring the information hold time of memory cell in a MIS (Metal-Insulator-Semiconductor) dynamic memory.

2. Description of the Prior Art

In a MIS dynamic memory wherein information is held by means of electrostatic capacitive charges, the recharging, i.e. refresshing at certain intervals is required during the performance of the memory. Therefore, it is important to measure the hold time for stored information of memory cell.

In the prior art method, the information hold time of a memory cell at a predetermined address in a MIS dynamic memory is measured by writing an information in that address and reading the written information when a predetermined time has lapsed after the interruption of application of clock pulses. In the actual operation, however, the information hold time of an address or bit is considerably decreased by the access to the neighboring addresses. For example, it has been revealed that the information hold time after the cease of clock pulses is about 100 ms but that when the access to the neighboring addresses is carried out, the hold time is reduced to 1 to 10 ms. This means that if the refreshing cycle for the memory cells is selected on the basis of the value obtained by the conventional measuring method, an erroneous operation may easily occur in the actual performance. Moreover, if the quality of a memory is estimated according to this conventional method, misjudgment may be incurred.

SUMMARY OF THE INVENTION

An object of the present invention is to provide a method of and an apparatus for measuring with high accuracy the information hold time of memory cell of a MIS dynamic memory.

According to the invention, information is written in a memory cell at a predetermined address, the access to other plural addresses is carried out for a fixed time period without refreshing the predetermined address, and the information stored in the memory cell of the predetermined address is thereafter read out. The level of the read information is compared with a predetermined threshold value in order to determine the information hold time of the memory cell.

DESCRIPTION OF THE PREFERRED EMBODIMENTS

Figure 1:
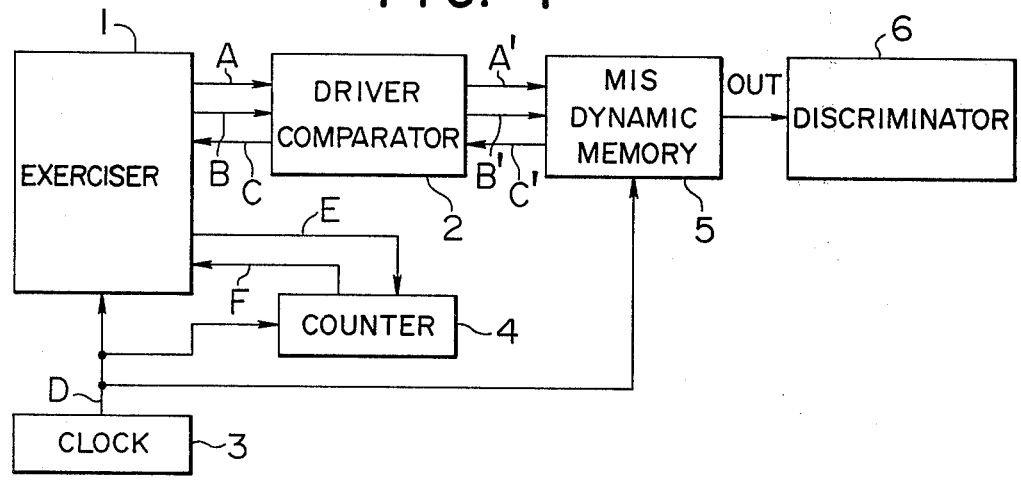
FIG. 1 is a block diagram of an embodiment of an apparatus for measuring the information hold time in a MIS dynamic memory in accordance with the present invention.

In FIG. 1 showing an embodiment of an apparatus according to the present invention, an exerciser or control section 1 processes address information A, write information B and read information C in accordance with a predetermined program. A driver comparator 2 performs the level conversion between information levels A - C (TTL levels) of the exerciser 1 and information levels A' - C' (MIS levels) of a MIS dynamic memory 5 having a plurality of memory cells. A clock pulse generator 3 supplies a clock signal D for the exerciser 1, the MIS dynamic memory 5 and a counter circuit 4. The counter circuit 4 counts the clock pulses D in response to a count command signal E from the exerciser 1 and delivers a count end signal F to the exerciser 1 when it has counted a predetermined number of pulses. This counter circuit 4 serves to measure the time of holding stored information. For example, in the case where a clock signal of 1 MHz is used, the counter circuit may possess seven digits for counting $10^3 - 10^5$ pulses which corresponds to 1 - 10 ms.

Figure 2:
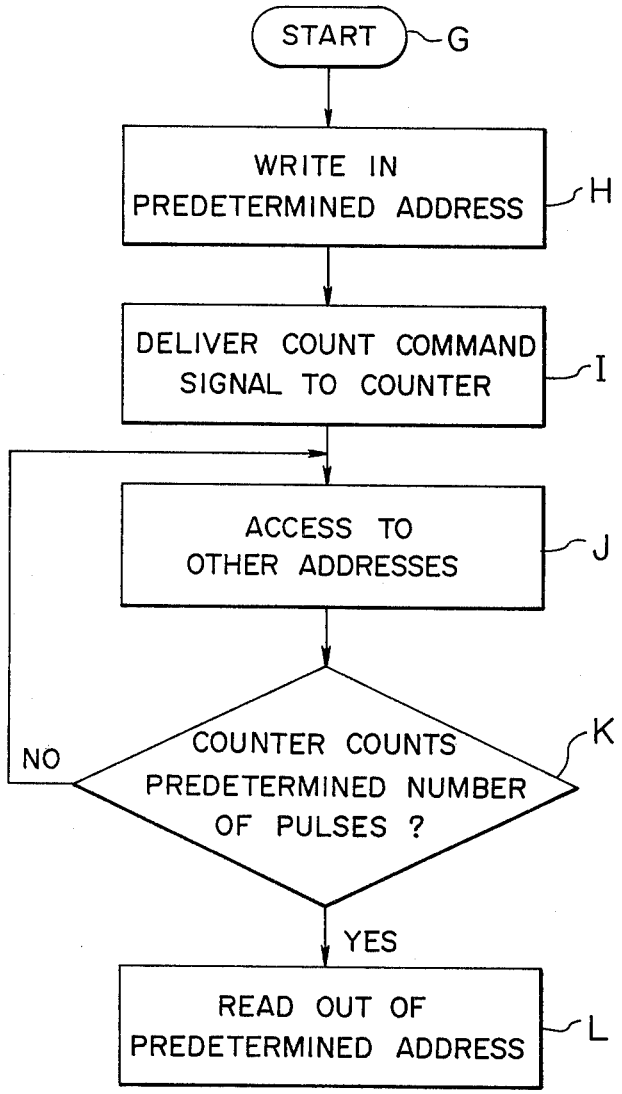
FIG. 2 is a flow chart illustrating an example of measurement method according to the invention.

FIG. 2 shows a flow chart of a program for illustrating the method for measuring the information hold time in accordance with the present invention. The sequential steps of the program will be described below.

Step G: In response to the start instruction, the exerciser 1 is initiated.

Step H: The exerciser 1 delivers write information to a predermined address of the memory 5. As a result, the information is written in the predetermined address.

Step I: The exerciser 1 sends a count command signal to the counter circuit 4 which in turn starts the counting of clock pulses from the clock generator 3.

Step J: The exerciser 1 delivers an instruction for writing or reading information in or out of plural addresses near the predetermined address under such a condition that the memory cell at the predetermined address is not refreshed. It should here be noted that, for example, in the case of a memory in which the memory cells connected in common with a work line but not connected with a designated bit line are outomatically refreshed, the memory cells having a common word line must not be subjected to any access such as writing and reading. In view of this point, a succession of accesses (such as writing and reading) depending upon the number of the program of the exerciser under consideration, are made to plural memory cells which are other than the predetermined memory cell and which adversely affect, the stored information of the predetermined memory cell when they are subjected to writing or reading operations.

Step K: Whether the counter circuit 4 has counted a predetermined number of pulses or not is checked after the succession of accesses. If the counting is not yet completed, the same series of accesses are repeated.

Step L: After the lapse of a predetermined time based on the output of the counter circuit 4, the information in the predetermined memory cell is read.

The level of the read information is compared with a predetermined threshold value to discriminate the quality of the memory. This can be effected by a discriminator 6 in which the predetermined threshold value is stored and which receives the read information OUT. The information hold time of the memory cell which time may be determined by such a comparison is the period from the time instant when the information is written in the memory cell till the time instant when the information having a required level is read out of the memory cell. The required level is determined depending upon the conditions in the practical use of the memory. A refreshing cycle can be selected on the basis of the thus measured information hold time.

As described above, according to the present invention, since the information hold time is measured under the worst condition practically possible, the precision in measurement can be improved. If the refreshing cycle is selected on the basis of the result of the measurement, an erroneous operation due to the erase of stored information etc. can be prevented. A memory in which the stored information varnishes in a practically tolerable time can be discriminated with high accuracy.

This invention is by no means limited to the above-described embodiment but various modifications are possible. For example, a timer may be used to determine the information hold time. The reading of stored information may be forcibly carried out after a predetermined time period, thereby estimating the information hold time from the level of the read information.

Also, the apparatus according to this invention can be realized by simply adding a counter circuit to a conventional memory tester, e.g. Type T320/30HM (TAKEDA RIKEN). In that case, any suitable counter circuit may be used.

Further, the counter circuit may be of a type which counts the times or number of successive accesses to the addresses other than the predetermined address. In that case, clock pulses are supplied to the accessing circuit and the counter circuit.

We claim:

1. A method of measuring the information hold time of memory cell in a MIS dynamic memory having a plurality of memory cells, comprising the steps of:

writing and storing information in a memory cell at a predetermined address of said memory;

carrying out the access to other plural addresses for a fixed time period without refreshing said memory cell of said predetermined address; and thereafter reading the stored information out of said memory cell of said predetermined address and comparing the level of the read information with a predetermined threshold value.

2. An apparatus for measuring the information hold time of memory cell in a MIS dynamic memory having a plurality of memory cells, comprising:

clock means for generating clock pulses;

a control section coupled to said clock means and operable in accordance with a predetermined program to deliver write information to a memory cell at a predetermined address of said memory, to carry out the access to other plural addresses for a fixed time period without refreshing said memory cell of said predetermined address, and to instruct the reading of the written information out of said memory cell of said predetermined address after the lapse of a predetermined time from the delivery of said write information;

counter means coupled to said clock means for detecting the lapse of said predetermined time; and discriminator means for comparing the level of the information read out of said memory cell of said predetermined address with a predetermined threshold level.

* * * * *